United States Patent
Shirahama et al.

(10) Patent No.: US 6,961,260 B2
(45) Date of Patent: Nov. 1, 2005

(54) SEMICONDUCTOR STORAGE CIRCUIT AND LAYOUT METHOD FOR THE SAME

(75) Inventors: Masanori Shirahama, Shiga (JP); Masashi Agata, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 57 days.

(21) Appl. No.: 10/802,860

(22) Filed: Mar. 18, 2004

(65) Prior Publication Data

US 2004/0184302 A1 Sep. 23, 2004

(30) Foreign Application Priority Data

Mar. 18, 2003 (JP) .............................. 2003-073225

(51) Int. Cl.[7] .............................................. G11C 5/06
(52) U.S. Cl. ...................... 365/63; 365/51; 365/230.06; 365/230.03
(58) Field of Search ........................ 365/63, 51, 230.06, 365/230.03

(56) References Cited

U.S. PATENT DOCUMENTS

| | | | |
|---|---|---|---|
| 6,580,629 B2 * | 6/2003 | Ogata | 365/63 |
| 2003/0042553 A1 * | 3/2003 | Yabe et al. | 257/390 |
| 2003/0072201 A1 | 4/2003 | Inaba | |

FOREIGN PATENT DOCUMENTS

JP  2002-25251 A  1/2002

* cited by examiner

Primary Examiner—Huan Hoang
(74) Attorney, Agent, or Firm—McDermott Will & Emery LLP

(57) ABSTRACT

The layout of the semiconductor storage circuit is generated by placing, along a word line direction, a desired number of a circuit extension units each of which includes a data access circuit section, memory cell sub arrays and a power circuit section arranged along a bit line direction. The data access circuit section is driven by a driver circuit provided in the data access circuit section, and the driving operation of the driver circuit is controlled by a driver circuit provided in a control circuit section. Also, a voltage supplying operation of the power circuit section is controlled by a driver circuit provided in a power control circuit section.

38 Claims, 8 Drawing Sheets

SEMICONDUCTOR STORAGE CIRCUIT AND LAYOUT METHOD FOR THE SAME

BACKGROUND OF THE INVENTION

The present invention relates to a semiconductor storage circuit (memory circuit), and more particularly, it relates to technology of a semiconductor storage circuit suitably included in a system LSI or an ASIC and a layout method for the semiconductor storage circuit.

The so-called memory embedded LSIs, such as a system on chip or a system LSI including both a logic circuit and a memory circuit on one chip and an ASIC (Application Specific Integrated Circuit) fabricated for specific use, have been recently remarkably developed so as to attain a larger circuit scale, more complicated functions and a higher operation speed. In accordance with the increase of the operation speed and the like, the storage capacity and the number of input/output terminals of a storage circuit included in a memory embedded LSI have been increasing.

The storage capacity and the I/O width required of a memory embedded LSI are varied depending upon user specification. Accordingly, in a conventional memory circuit, a driver circuit is provided in accordance with the maximum storage capacity and the maximum I/O width that a chip can possibly attain, and the driving ability of the driver circuit is set to the maximum value. Thus, the memory embedded LSI can cope with any user specification within the limits of functions that can be provided by the memory embedded LSI.

In order to ease the placement and routing and the layout design accompanied by the change of the number of memory cell arrays, technique to place circuits so as to relax crowdedness of wirings has been disclosed (in, for example, Japanese Laid-Open Patent Publication No. 2002-25251). In a memory according to this technique, however, a control signal line for controlling the operation of a memory cell array is driven intensively at an end of the memory cell array. In such an architecture, the ability of a driver circuit for driving the control signal line should be individually determined in accordance with storage capacity to be set, or should be large enough in accordance with the maximum possible storage capacity.

The architecture of a memory circuit used in a conventional memory embedded LSI is optimum when the storage circuit is realized with the maximum storage capacity and the maximum I/O width. In the case where an actually constructed storage circuit has comparatively small storage capacity and I/O width, however, a driver circuit designed in accordance with the maximum storage capacity and the maximum I/O width has excessive driving ability over the load of the storage circuit, and also wastefully occupies a limited circuit area within the chip. Furthermore, in a storage circuit such as a DRAM (Dynamic Random Access Memory) necessary to provide an internal power circuit, the electric power is wastefully consumed by the excessive driving ability of a driver circuit for the power supply.

On the other hand, in the case where the driving ability of a driver circuit is individually determined in accordance with the storage capacity and the I/O width to be set, the design is complicated, and there arises another problem that the development of another circuit with different storage capacity requires a long period of time and high cost.

SUMMARY OF THE INVENTION

In consideration of the aforementioned conventional problems, an object of the invention is providing a semiconductor storage circuit which can perform a high speed or low power consumption operation by optimizing the driving ability of a driver circuit in accordance with a storage capacity or the like and in which the storage capacity can be set to a desired value while suppressing a chip area. Another object is providing such a semiconductor storage circuit in a short period of time at low cost.

In order to achieve the object, the semiconductor storage circuit of this invention includes a memory cell array in which memory cell sub arrays each including a plurality of memory cells are arranged in an array along a bit line direction corresponding to a column direction and a word line direction corresponding to a row direction; data access circuit sections each of which is provided correspondingly to a column of the memory cell sub arrays arranged along the bit line direction and includes a data access circuit for making data accesses to memory cells of one or more of the memory cell sub arrays belonging to the column and a first driver circuit for driving the data access circuit; and a control circuit section for controlling the data access circuit through the first driver circuit. In this semiconductor storage circuit, the data access circuit sections are disposed along the word line direction at a pitch equal to a pitch at which one or more of the memory cell sub arrays are disposed along the word line direction.

According to the invention, each data access circuit section includes not only the data access circuit but also the driver circuit for driving the data access circuit, and the data access circuit sections are disposed along the word line direction at the pitch equal to the dimension along the word line direction of at least one of the memory cell sub arrays. Therefore, even when the number of memory cell sub arrays arranged along the word line direction is increased for increasing the storage capacity, the total ability of the driver circuits can be set to an optimum value for driving the data access circuits by merely increasing the number of data access circuit sections in accordance with the increase of the memory cell sub arrays. Also, since each data access circuit section includes the driver circuit, the driving ability of the control circuit section can be small and hence can be reduced in its scale. Accordingly, a semiconductor storage circuit capable of a high speed operation and having a suppressed chip area can be realized.

Preferably, the pitch at which the data access circuit sections are disposed along the word line direction corresponds to a length along the word line direction of a circuit extension unit used for increasing storage capacity of the semiconductor storage circuit by increasing a number of the memory cell sub arrays arranged along the word line direction.

Thus, the optimum ability of the driver circuits can be set in accordance with the increase of the storage capacity of the semiconductor storage circuit without causing a wasteful area.

Preferably, the semiconductor storage circuit further includes power circuit sections each of which is provided correspondingly to a column of the memory cell sub arrays arranged along the bit line direction and supplies a power voltage, used in the semiconductor storage circuit; and a power control circuit section for controlling a voltage supplying operation of the power circuit sections. Also, the power circuit sections are disposed along the word line direction at a pitch equal to the pitch at which one or more of the memory cell sub arrays are disposed along the word line direction.

Thus, when the semiconductor storage circuit is, for example, a DRAM necessary to provide internal power, the power circuit section for supplying the internal power voltage can be provided in the number according to the number of columns of the memory cell sub arrays, namely, the scale of the memory cell array. The voltage supplying operation of the power circuit section is controlled by the power control circuit section. Thus, a semiconductor storage circuit having a power circuit with neither too large nor too small current supplying ability can be realized.

More preferably, the pitch at which the power circuit sections are disposed along the word line direction corresponds to a length along the word line direction of a circuit extension unit used for increasing storage capacity of the semiconductor storage circuit by increasing a number of the memory cell sub arrays arranged along the word line direction.

Thus, the optimum ability of the power circuits can be set in accordance with the increase of the storage capacity of the semiconductor storage circuit without causing a wasteful area.

Alternatively, preferably the semiconductor storage circuit further includes a row decoder circuit for selecting a word line of the memory cell array, and each of the data access circuit sections includes a data line driver circuit for driving a data line of the memory cell array, the control circuit section includes a second driver circuit and controls an operation of the row decoder circuit through the second driver circuit, and the data line driver circuit and the second driver circuit are linearly arranged.

Thus, since the driver circuit of the control circuit section and the data line driver circuit are linearly arranged, in the case where the sizes of these driver circuits are increased or reduced in accordance with the increase or reduction of the storage capacity, merely the width of the area where they are linearly arranged may be increased or reduced. Thus, a semiconductor storage circuit with a small chip area can be easily realized with occurrence of a wasteful space suppressed.

Furthermore, in the semiconductor storage circuit, each of the memory cell sub arrays of the memory cell array preferably includes a break area where placement of the memory cells is interrupted, and the first driver circuit is preferably disposed in each of the data access circuit sections in an area extending from the break area along the bit line direction.

Thus, in the case where the memory cell sub array includes the break area, the driver circuit of the data access circuit section is placed in the area extending from the break area along the bit line direction. As a result, the area, which is generally a space area, can be effectively utilized so as to optimize the circuit scale of the semiconductor storage circuit.

The break area corresponds, for example, to a contact area of a strapping wire used for reducing resistance of a word line of each of the memory cell sub arrays of the memory cell array, or an area occupied by a sub word driver provided to each of the memory cell sub arrays of the memory cell array.

Alternatively, in order to achieve the object, the semiconductor storage circuit of this invention includes a memory cell array in which memory cell sub arrays each including a plurality of memory cells are arranged in an array along a bit line direction corresponding to a column direction and a word line direction corresponding to a row direction, row decoder sections each of which is provided correspondingly to a row of the memory cell sub arrays arranged along the word line direction and includes a row decoder circuit for selecting a word line of one or more of the memory cell sub arrays belonging to the row and a row decoder driver circuit for driving the row decoder circuit; and a control circuit section for controlling an operation of the row decoder circuit through the row decoder driver circuit. In this semiconductor storage circuit, the row decoder sections are disposed along the bit line direction at a pitch equal to a pitch at which one or more of the memory cell sub arrays are disposed along the bit line direction.

According to the invention, each row decoder section includes not only the row decoder circuit but also the row decoder driver circuit for driving, the row decoder circuit, and the row decoder sections are disposed along the bit line direction at the pitch equal to the dimension along the bit line direction of at least one of the memory cell sub arrays. Therefore, even when the number of memory cell sub arrays arranged along the bit line direction is increased for increasing the storage capacity, the total ability of the row decoder driver circuits can be set to an optimum value for driving the row decoder circuits by merely increasing the number of row decoder sections in accordance with the increase of the memory cell sub arrays. Also, since each row decoder section includes the driver circuit, the driving ability of the control circuit section can be small and hence can be reduced in its scale. Accordingly, a semiconductor storage circuit capable of a high speed operation and having a suppressed chip area can be realized.

Preferably, the pitch at which the row decoder sections are disposed along the bit line direction corresponds to a length along the bit line direction of a circuit extension unit used for increasing storage capacity of the semiconductor storage circuit by increasing a number of the memory cell sub arrays arranged along the bit line direction.

Thus, the optimum ability of the row decoder driver circuits can be set in accordance with the increase of the storage capacity of the semiconductor storage circuit without causing a wasteful area.

Preferably, the semiconductor storage circuit further includes power circuit sections each of which is provided correspondingly to a row of the memory cell sub arrays arranged along the word line direction and supplies a power voltage used in the semiconductor storage circuit; and a power control circuit section for controlling a voltage supplying operation of the power circuit sections, and the power circuit sections are disposed along the bit line direction at a pitch equal to the pitch at which one or more of the memory cell sub arrays are disposed along the bit line direction.

Thus, when the semiconductor storage circuit is, for example, a DRAM necessary to provide internal power, the power circuit section for supplying the internal power voltage can be provided in the number according to the number of rows of the memory cell sub arrays, namely, the scale of the memory cell array. The voltage supplying operation of the power circuit section is controlled by the power control circuit section. Thus, a semiconductor storage circuit having a power circuit with neither too large nor too small current supplying ability can be realized.

More preferably, the pitch at which the power circuit sections are disposed along the bit line direction corresponds to a length along the bit line direction of a circuit extension unit used for increasing storage capacity of the semiconductor storage circuit by increasing a number of the memory cell sub arrays arranged along the bit line direction.

Thus, the optimum ability of the power circuits can be set in accordance with the increase of the storage capacity of the semiconductor storage circuit without causing a wasteful area.

Preferably, the semiconductor storage circuit further includes a data access circuit for making data accesses to the memory cells of the memory cell array, and each of the row decoder sections includes a word line driver circuit for driving a word line of the memory cell array selected by the row decoder circuit, the control circuit section includes a third driver circuit and controls an operation of the data access circuit through the third driver circuit, and the word line driver circuit and the third driver circuit are linearly arranged.

Thus, since the driver circuit of the control circuit section and the word line driver circuit are linearly arranged, in the case where the sizes of these driver circuits are increased or reduced in accordance with the increase or reduction of the storage capacity, merely the width of the area where they are linearly arranged may be increased or reduced. Thus, a semiconductor storage circuit with a small chip area can be easily realized with occurrence of a wasteful space suppressed.

Alternatively, in order to achieve the object, the semiconductor storage circuit of this invention includes a memory cell array in which memory cell sub arrays each including a plurality of memory cells are arranged in an array along a bit line direction corresponding to a column direction and a word line direction corresponding to a row direction, data access circuit sections each of which is provided correspondingly to a column of the memory cell sub arrays arranged along the bit line direction and includes a data access circuit for making data accesses to one or more of the memory cell sub arrays belonging to the column and a first driver circuit for driving the data access circuit; row decoder sections each of which is provided correspondingly to a row of the memory cell sub arrays arranged along the word line direction and includes a row decoder circuit for selecting a word line of one or more of the memory cell sub arrays belonging to the row and a row decoder driver circuit for driving the row decoder circuit; and a control circuit section for controlling an operation of the data access circuit through the first driver circuit and controlling an operation of the row decoder circuit through the row decoder driver circuit. In this semiconductor storage circuit, the data access circuit sections are disposed along the word line direction at a pitch equal to a pitch at which one or more of the memory cell sub arrays are disposed along the word line direction, and the row decoder sections are disposed along the bit line direction at a pitch equal to a pitch at which one or more of the memory cell sub arrays are disposed along the bit line direction.

According to the invention, each data access circuit section includes not only the data access circuit but also the driver circuit for driving the data access circuit, and the data access circuit sections are disposed along the word line direction at the pitch equal to the dimension along the word line direction of at least one of the memory cell sub arrays. Furthermore, each row decoder section includes not only the row decoder circuit but also the row decoder driver circuit for driving the row decoder circuit, and the row decoder sections are disposed along the bit line direction at the pitch equal to the dimension along the bit line direction of at least one of the memory cell sub arrays. Therefore, even when the number of memory cell sub arrays arranged along the word line direction and the bit line direction is increased for increasing the storage capacity, the total abilities of the driver circuits and the row decoder driver circuits can be set to optimum values by merely increasing the numbers of data access circuit sections and row decoder sections in accordance with the increase of the memory cell sub arrays. Also, since each data access circuit section includes the driver circuit and each row decoder section includes the row decoder driver circuit, the driving ability of the control circuit section can be small and hence can be reduced in its scale. Accordingly, a semiconductor storage circuit capable of a high speed operation and having a suppressed chip area can be realized.

Preferably, the pitch at which the data access circuit sections are disposed along the word line direction corresponds to a length along the word line direction of a circuit extension unit used for increasing storage capacity of the semiconductor storage circuit by increasing a number of the memory cell sub arrays arranged along the word line direction, and the pitch at which the row decoder sections are disposed along the bit line direction corresponds to a length along the bit line direction of a circuit extension unit for increasing the storage capacity of the semiconductor storage circuit by increasing a number of the memory cell sub arrays arranged along the bit line direction.

Thus, the optimum abilities of the driver circuits and the row decoder driver circuits can be set in accordance with the increase of the storage capacity of the semiconductor storage circuit without causing a wasteful area.

Preferably, the semiconductor storage circuit further includes power circuit sections each of which is provided correspondingly to a column of the memory cell sub arrays arranged along the bit line direction and supplies a power voltage used in the semiconductor storage circuit; and a power control circuit section for controlling a voltage supplying operation of the power circuit sections, and the power circuit sections are disposed along the word line direction at a pitch equal to the pitch at which one or more of the memory cell sub arrays are disposed along the word line direction.

More preferably, the pitch at which the power circuit sections are disposed along the word line direction corresponds to a length along the word line direction of a circuit extension unit used for increasing storage capacity of the semiconductor storage circuit by increasing a number of the memory cell sub arrays arranged along the word line direction.

Alternatively, preferably, the semiconductor storage circuit further includes power circuit sections each of which is provided correspondingly to a row of the memory cell sub arrays arranged along the word line direction and supplies a power voltage used in the semiconductor storage circuit; and a power control circuit section for controlling a voltage supplying operation of the power circuit sections, and the power circuit sections are disposed along the bit line direction at a pitch equal to the pitch at which one or more of the memory cell sub arrays are disposed along the bit line direction.

More preferably, the pitch at which the power circuit sections are disposed along the bit line direction corresponds to a length along the bit line direction of a circuit extension unit used for increasing storage capacity of the semiconductor storage circuit by increasing a number of the memory cell sub arrays arranged along the bit line direction.

Specifically, each of the aforementioned power circuit sections includes at least one of a bit line precharge power circuit for supplying a precharging voltage for a bit line of the memory cell sub arrays and a word line power circuit for supplying an activating voltage for a word line of the memory cell sub arrays.

Furthermore, in order to achieve the object, the layout method of this invention for a semiconductor storage circuit including a memory cell array in which memory cell sub arrays each including a plurality of memory cells are arranged in an array along a bit line direction corresponding to a column direction and a word line direction corresponding to a row direction, includes the steps of respectively generating layouts of the memory cell sub arrays and a data access circuit section which is provided correspondingly to a column of the memory cell sub arrays arranged along the bit line direction and includes a data access circuit for making data accesses to the memory cells of one or more of the memory cell sub arrays belonging to the column and a first driver circuit for driving the data access circuit; and repeatedly placing the memory cell sub arrays and the data access circuit section along the word line direction in such a manner that the data access circuit sections are disposed along the word line direction at a pitch equal to a pitch at which one or more of the memory cell sub arrays are disposed along the word line direction.

According to the invention, the data access circuit sections, each of which includes not only the data access circuit but also the driver circuit for driving the data access circuit, are disposed along the word line direction at the pitch equal to the dimension along the word line direction of at least column of the memory cell sub arrays. Therefore, even when the number of memory cell sub arrays arranged along the word line direction is increased for increasing the storage capacity the total ability of the driver circuits can be set to an optimum value for driving the data access circuits merely by increasing the number of data access circuit sections in accordance with the increase of the memory cell sub arrays. Accordingly, a semiconductor storage circuit capable of a high speed operation and having a suppressed chip area can be easily realized.

Preferably, the pitch at which the data access circuit sections are disposed along the word line direction corresponds to a length along the word line direction of a circuit extension unit used for increasing storage capacity of the semiconductor storage circuit by increasing a number of the memory cell sub arrays arranged along the word line direction.

Thus, the optimum ability of the driver circuits can be set in accordance with the increase of the storage capacity of the semiconductor storage circuit without causing a wasteful area.

Preferably, the layout method for a semiconductor storage circuit further includes the steps of generating a layout of a power circuit section which is provided correspondingly to a column of the memory cell sub arrays arranged along the bit line direction and supplies a power voltage used in the semiconductor storage circuit; and repeatedly placing the power circuit section along the word line direction in such a manner that the power circuit sections are disposed along the word line direction at a pitch equal to the pitch at which one or more of the memory cell sub arrays are disposed along the word line direction.

Thus, when the semiconductor storage circuit is, for example, a DRAM necessary to provide internal power, the power circuit section for supplying the internal power voltage can be provided in the number according to the storage capacity in accordance with the number of columns of the memory cell sub arrays, namely, the scale of the memory cell array. Thus, a semiconductor storage circuit having a power circuit with neither too large nor too small current supplying ability can be realized.

More preferably, the pitch at which the power circuit sections are disposed along the word line direction corresponds to a length along the word line direction of a circuit extension unit used for increasing storage capacity of the semiconductor storage circuit by increasing a number of the memory cell sub arrays arranged along the word line direction.

Thus, the optimum ability of the power circuits can be set in accordance with the increase of the storage capacity of the semiconductor storage circuit without causing a wasteful area.

Preferably, the layout method for a semiconductor storage circuit further includes the steps of generating a layout of a control circuit section that has a second driver circuit and controls an operation of a row decoder circuit for selecting a word line of the memory cell array through the second driver circuit; and placing the control circuit section to be arranged along the word line direction together with the data access circuit sections, and each of the data access circuit sections includes a data line driver circuit for driving a data line of the memory cell array, and the data line driver circuit and the second driver circuit are linearly arranged.

Thus, since the driver circuit of the control circuit section and the data line driver circuit are linearly arranged, in the case where the sizes of these driver circuits are increased or reduced in accordance with the increase or reduction of the storage capacity, merely the width of the area where they are linearly arranged may be increased or reduced. Thus, a semiconductor storage circuit with a small chip area can be easily realized with occurrence of a wasteful space suppressed.

More preferably, lengths along the bit line direction of circuit areas of the data line driver circuit and the second driver circuit are increased or reduced in accordance with increase or reduction of storage capacity of the semiconductor storage circuit performed by increasing or reducing a number of the memory cell sub arrays arranged along the bit line direction.

Alternatively, in order to achieve the object, the layout method of this invention for a semiconductor storage circuit including a memory cell array in which memory cell sub arrays each including a plurality of memory cells are arranged in an array along a bit line direction corresponding to a column direction and a word line direction corresponding to a row direction, includes the steps of respectively generating layouts of the memory cell sub arrays and a row decoder section which is provided correspondingly to a row of the memory cell sub arrays arranged along the word line direction and includes a row decoder circuit for selecting a word line of one or more of the memory cell sub arrays belonging to the row and a row decoder driver circuit for driving the row decoder circuit; and repeatedly placing the memory cell sub arrays and the row decoder section along the bit line direction in such a manner that the row decoder sections are disposed along the bit line direction at a pitch equal to a pitch at which one or more of the memory cell sub arrays are disposed along the bit line direction.

According to the invention, the row decoder sections, each of which includes not only the row decoder circuit but also the row decoder driver circuit for driving the row decoder circuit, are disposed along the word line direction at the pitch equal to the dimension along the bit line direction of at least one of the memory cell sub arrays. Therefore, even when the number of memory cell sub arrays arranged along the bit line direction is increased for increasing the storage capacity, the total ability of the row decoder driver circuits can be set to an optimum value for driving the row decoder circuits by merely increasing the number of row decoder sections in accordance with the increase of the memory cell sub arrays. Also, since the row decoder section includes the driver circuit, the driving ability of the control circuit section can be small and hence can be reduced in its scale. Accordingly, a semiconductor storage circuit capable of a high speed operation and having a suppressed chip area can be realized.

Preferably, the pitch at which the row decoder sections are disposed along the bit line direction corresponds to a length along the bit line direction of a circuit extension unit used for increasing storage capacity of the semiconductor storage circuit by increasing a number of the memory cell sub arrays arranged along the bit line direction.

Thus, the optimum ability of the row decoder driver circuits can be set in accordance with the increase of the storage capacity of the semiconductor storage circuit without causing a wasteful area.

Preferably, the layout method for a semiconductor storage circuit further includes the steps of generating a layout of a power circuit section which is provided correspondingly to a row of the memory cell sub arrays arranged along the word line direction and supplies a power voltage used in the semiconductor storage circuit and repeatedly placing the power circuit section along the bit line direction in such a manner that the power circuit sections are disposed along the bit line direction at a pitch equal to the pitch at which one or more of the memory cell sub arrays are disposed along the bit line direction.

Thus, when the semiconductor storage circuit is, for example a DRAM necessary to provide internal power, the power circuit section for supplying the internal power voltage can be provided in the number according to the storage capacity in accordance with the number of rows of the memory cell sub arrays, namely, the scale of the memory cell array. Thus, a semiconductor storage circuit having a power circuit with neither too large nor too small current supplying ability can be realized.

More preferably, the pitch at which the power circuit sections are disposed along the bit line direction corresponds to a length along the bit line direction of a circuit extension unit used for increasing storage capacity of the semiconductor storage circuit by increasing a number of the memory cell sub arrays arranged along the bit line direction.

Thus, the optimum ability of the power circuits can be set in accordance with the increase of the storage capacity of the semiconductor storage circuit without causing a wasteful area.

Preferably, the layout method for a semiconductor storage circuit further includes the steps of generating a layout of a control circuit section that has a third driver circuit and controls an operation of a data access circuit for making data accesses to the memory cells of the memory cell array through the third driver circuit; and placing the control circuit section to be arranged along the bit line direction together with the row decoder sections, and the row decoder section includes a word line driver circuit for driving a word line of the memory cell array selected by the row decoder circuit, and the word line driver circuit and the third driver circuit are linearly arranged.

Thus, since the driver circuit of the control circuit section and the word line driver circuit are linearly arranged, in the case where the sizes of these driver circuits are increased or reduced in accordance with the increase or reduction of the storage capacity, merely the width of the area where they are linearly arranged may be increased or reduced. Thus, a semiconductor storage circuit with a small chip area can be easily realized with occurrence of a wasteful space suppressed.

More preferably, lengths along the word line direction of circuit areas of the word line driver circuit and the third driver circuit are increased or reduced in accordance with increase or reduction of storage capacity of the semiconductor storage circuit performed by increasing or reducing a number of the memory cell sub arrays arranged along the word line direction.

Alternatively, in order to achieve the object, the layout method of this invention for a semiconductor storage circuit including a memory cell array in which memory cell sub arrays each including a plurality of memory cells are arranged in an array along a bit line direction corresponding to a column direction and a word line direction corresponding to a row direction, includes he steps of respectively generating layouts of the memory cell sub arrays, a data access circuit section which is provided correspondingly to a column of the memory cell sub arrays arranged along the bit line direction and includes a data access circuit for making data accesses to the memory cells of one or more of the memory cell sub arrays belonging to the column and a first driver circuit for driving the data access circuit, and a row decoder section which is provided correspondingly to a row of the memory cell sub arrays arranged along the word line direction and includes a row decoder circuit for selecting a word line of one or more of the memory cell sub arrays belonging to the row and a row decoder driver circuit for driving the row decoder circuit; and repeatedly placing the memory cell sub arrays and the data access circuit section along the word line direction in such a manner that the data access circuit sections are disposed along the word line direction at a pitch equal to a pitch at which one or more of the memory cell sub arrays are disposed along the word line direction and repeatedly placing the memory cell sub arrays and the row decoder section along the word line direction in, such a manner that the row decoder sections are disposed along the bit line direction at a pitch equal to a pitch at which one or more of the memory cell sub arrays are disposed along the bit line direction.

According to the invention, the data access circuit sections, each of which includes not only the data access circuit but also the driver circuit for driving the data access circuit, are disposed along the word line direction at the pitch equal to the dimension along the word line direction of at least one of the memory cell sub arrays. Furthermore, the row decoder sections, each of which includes not only the row decoder circuit but also the row decoder driver circuit for driving the row decoder circuit, are disposed along the bit line direction at the pitch equal to the dimension along the bit line direction of at least one of the memory cell sub arrays. Therefore, even when the number of memory cell sub arrays arranged along the word line direction and the bit line direction is increased for increasing the storage capacity, the total abilities of the driver circuits and the row decoder driver circuits can be set to optimum values merely by increasing the number of data access circuit sections and row decoder sons in accordance with the increase of the memory cell sub arrays. Accordingly, a semiconductor storage circuit capable of a high speed operation and having a suppressed chip area can be easily realized.

Preferably, the pitch at which the data access circuit sections are disposed along the word line direction corresponds to a length along the word line direction of a circuit extension unit used for increasing storage capacity of the semiconductor storage circuit by increasing a number of the memory cell sub arrays arranged along the word line direction, and the pitch at which the row decoder sections are disposed along the bit line direction corresponds to a length along the bit line direction of a circuit extension unit used for increasing the storage capacity of the semiconductor storage circuit by increasing a number of the memory cell sub arrays arranged along the bit line direction.

Thus, the optimum ability of the driver circuits of the data access circuit section and the optimum ability of the row decoder driver circuits can be set in accordance with the increase of the storage capacity of the semiconductor storage circuit without causing a wasteful area.

Preferably, the layout method for a semiconductor storage circuit further includes the steps of generating a layout of a power circuit section which is provided correspondingly to a column of the memory cell sub arrays arranged along the bit line direction and supplies a power voltage used in the semiconductor storage circuit; and repeatedly placing the power circuit section along the word line direction in such a manner that the power circuit sections are disposed along the word line direction at a pitch equal to the pitch at which one or more of the memory cell sub arrays are disposed along the word line direction.

Thus, when the semiconductor storage circuit is, for example a DRAM necessary to provide internal power, the power circuit section for supplying the internal power voltage can be provided in the number according to the storage capacity in accordance with the number of columns of the memory cell sub arrays, namely, the scale of the memory cell array. Thus, a semiconductor storage circuit having a power circuit with neither too large nor too small current supplying ability can be realized.

More preferably, the pitch at which the power circuit sections are disposed along the word line direction corresponds to a length along the word line direction of a circuit extension unit used for increasing storage capacity of the semiconductor storage circuit by increasing a number of the memory cell sub arrays arranged along the word line direction.

Thus, the optimum ability of the power circuits can be set in accordance with the increase of the storage capacity of the semiconductor storage circuit without causing a wasteful area.

Preferably, the layout method for a semiconductor storage circuit further includes the steps of generating a layout of a power circuit section that is provided correspondingly to a row of the memory cell sub arrays arranged along the word line direction and supplies a power voltage used in the semiconductor storage circuit, and repeatedly placing the power circuit section along the bit line direction in such a manner that the power circuit sections are disposed along the bit line direction at a pitch equal to the pitch at which one or more of the memory cell sub arrays are disposed along the bit line direction.

More preferably, the pitch at which the power circuit sections are disposed along the bit line direction corresponds to a length along the bit line direction of a circuit extension unit used for increasing storage capacity of the semiconductor storage circuit by increasing a number of the memory cell sub arrays arranged along the bit line direction.

DETAILED DESCRIPTION OF THE INVENTION

Preferred embodiments of the invention will now be described with reference to the accompanying drawings.

Embodiment 1

Figure 1:
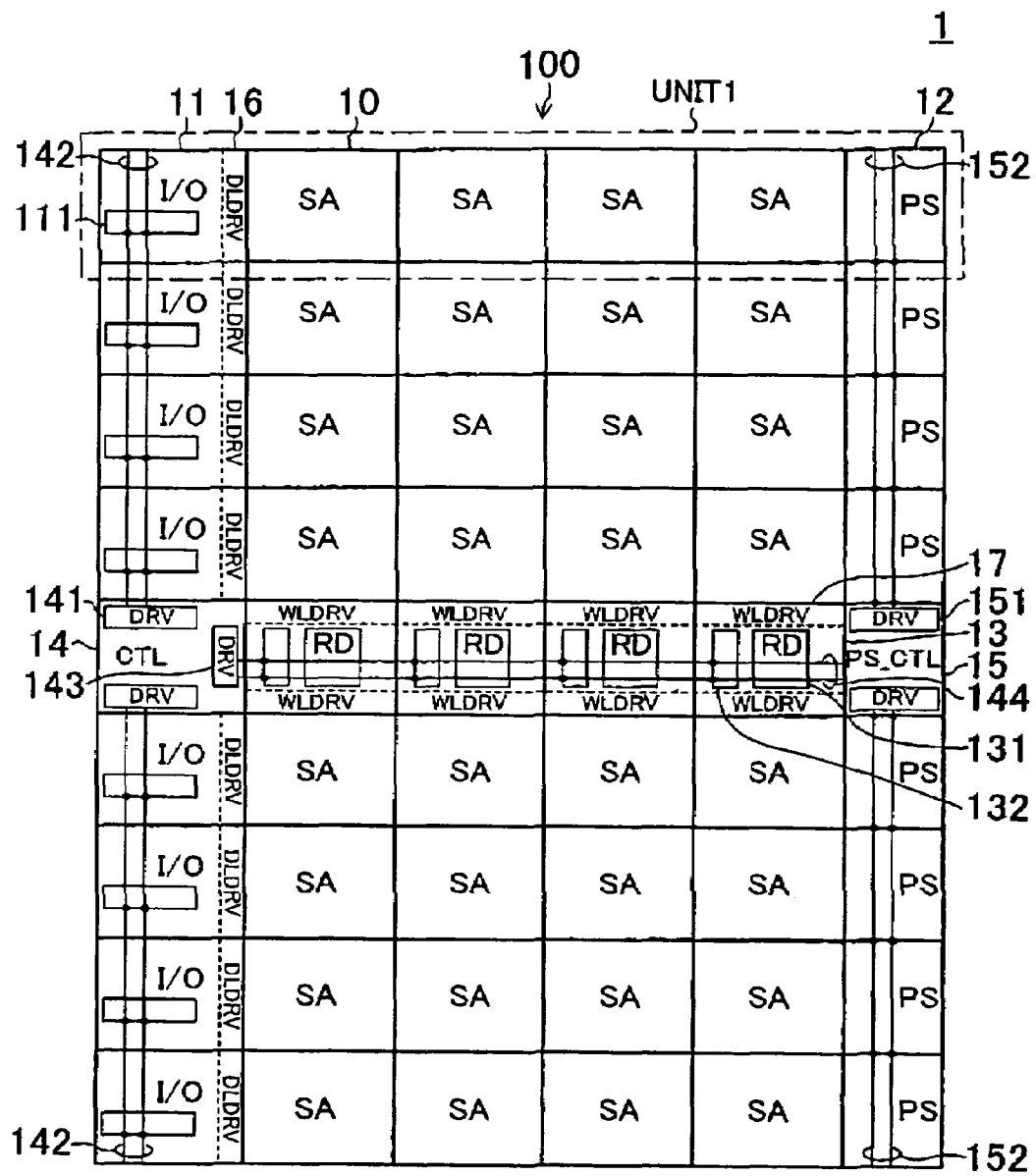
FIG. 1 is a layout diagram of a semiconductor storage circuit according to Embodiment 1 of the invention.

FIG. 1 shows the layout of a semiconductor storage circuit according to Embodiment 1 of the invention. The semiconductor storage circuit 1 of this embodiment includes a memory cell array 100 in which memory cell sub arrays 10 are arranged in an array of four lines along a bit line direction (i.e., a column direction corresponding to the lateral direction on FIG. 1) by eight lines along a word line direction (i.e., a row direction corresponding to the longitudinal direction on FIG. 1).

In the semiconductor storage circuit 1, the four memory cell sub arrays 10, a data access circuit section 11 for making data accesses to memory cells, namely, for reading or writing data in or from a selected memory cell, of these memory cell sub arrays 10, and a power circuit section 12 are arranged along the bit line direction. Also, the eight memory cell sub arrays 10 and a row decoder section 13 are arranged along the word line direction. Furthermore, a control circuit section 14 for controlling the data access circuit sections 11 and the row decoder sections 13 on the basis of signals externally supplied to the semiconductor storage circuit 1 is provided on an intersecting point between the line of the data access circuit sections 11 and the line of the row decoder sections 13. Furthermore, a power control circuit section 15 for controlling the power circuit sections 12 is provided on an intersecting point between the line of the power circuit sections 12 and the line of the row decoder sections 13.

Each data access circuit section 11 has a data line driver circuit 16 connected to data lines shared by the four memory cell sub arrays 10 arranged along the bit line direction. The data line driver circuit 16 applies a predetermined voltage to a data line selected by the data access circuit section 11 so as to drive the data line.

Also, each data access circuit section 11 includes, as data access circuits, a data input/output buffer circuit, a data bus selection circuit, a read amplifier/write buffer circuit and the like as described later, and further has a driver circuit 111 for driving these data access circuits. The respective driver circuits 111 are connected to one another through signal lines 142 extending from a driver circuit 141 of the control circuit section 14 that drives the signal lines 142 for transferring a signal generated by the control circuit section 14 and supplied to each data access circuit section 11, and each driver circuit 111 is controlled in accordance with a control signal output by the driver circuit 141 of the control circuit section 14.

The power circuit section 12 supplies a voltage necessary for the operation of the semiconductor storage circuit 1. The current supplying ability of each power circuit section 12 is restricted to an extent necessary and sufficient for the corresponding four memory cell sub arrays 10.

The respective power circuit sections 12 are connected to one another through signal lines 152 extending from a driver circuit 151 of the power control circuit section 15, and each power circuit section 12 is controlled in accordance with a control signal driven by the driver circuit 151.

Each row decoder section 13 has a row decoder circuit 131 and a word line driver circuit 17. The row decoder circuit 131 selects a word line (not shown) connected to the eight memory cell sub arrays 10 arranged along the word line direction, and activates/deactivates the selected word line through the word line driver circuit 17. The word line driver circuit 17 applies a predetermined voltage to the word line selected by the row decoder circuit 131 so as to drive the word line.

Each row decoder section 13 further has a row decoder driver circuit 132 to be used for driving the row decoder circuit 131. The respective row decoder driver circuits 132 are connected to one another through signal lines 144 extending from a driver circuit 143 of the control circuit section 14, and each row decoder driver circuit 132 is controlled in accordance with a control signal generated by the control circuit section 14 and transferred through the signal lines 144 driven by the driver circuit 143.

Furthermore, each of the four memory cell sub arrays 10 and the corresponding data access circuit section 11 and power circuit section 12 arranged along the bit line direction has a substantially equal dimension along the word line direction, and four groups each consisting of the four memory cell sub arrays 10, the data access circuit section 11 and the power circuit section 12 are arranged at an equal pitch along the word line direction respectively on and below the line of the row decoder sections 13. Similarly, each of the eight memory cell sub arrays 10 and the corresponding row decoder section 13 arranged along the word line direction has a substantially equal dimension along the bit line direction, and four groups each consisting of the eight memory cell sub arrays 10 and the row decoder section 13 are arranged at an equal pitch along the bit line direction.

Furthermore, the driver circuit 141, the word line driver circuits 17 and the driver circuit 151 are arranged along the bit line direction. Similarly, the driver circuit 143 and the data line driver circuits 16 are arranged along the word line direction.

Next, the architecture of the data access circuit section 11 will be described in detail.

Figure 2:
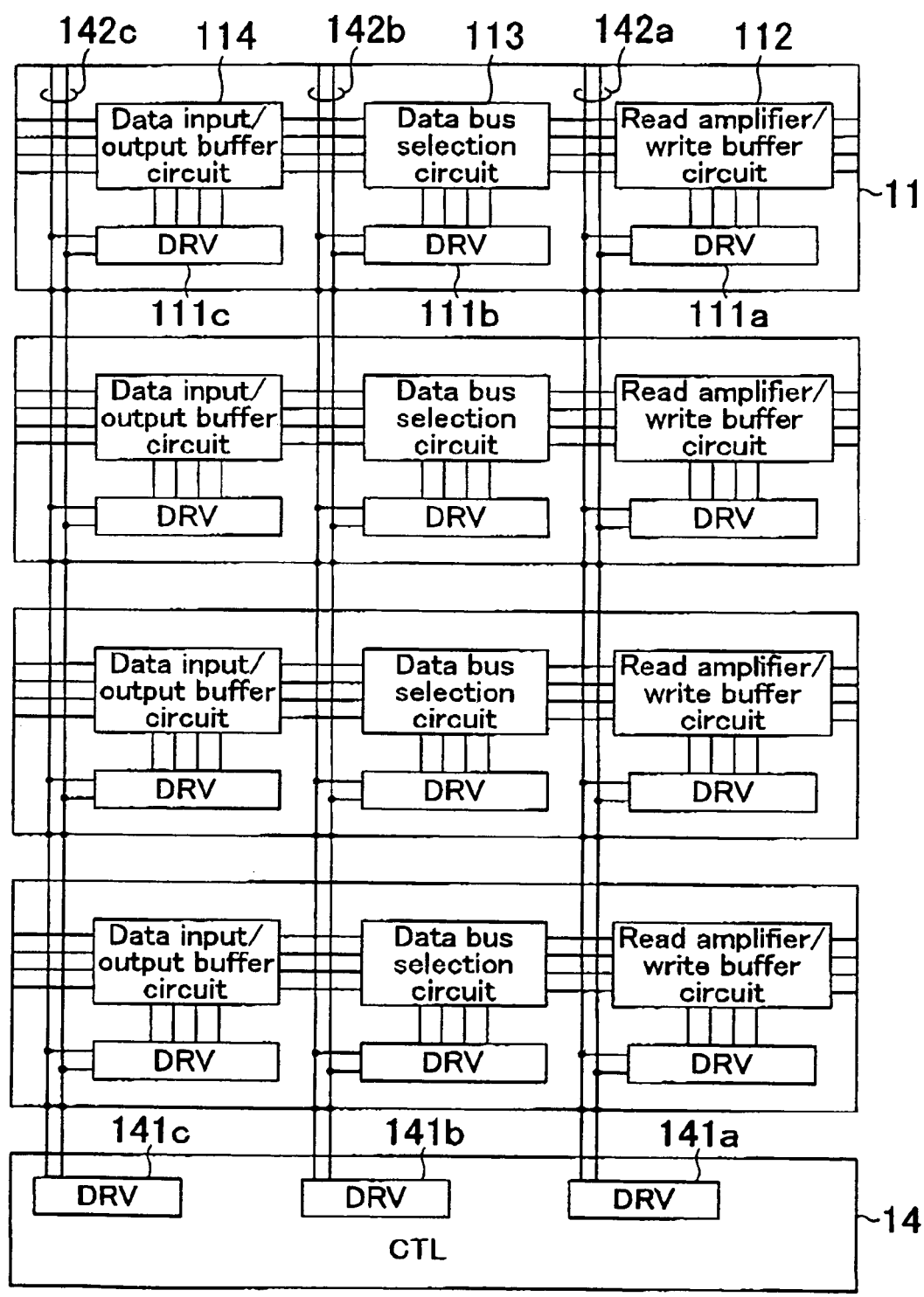
FIG. 2 is a diagram for showing the internal architecture of a data access circuit section.

FIG. 2 shows the internal architecture of the data access circuit section 11. The data access circuit section 11 includes, as the data access circuits, a read amplifier/write buffer circuit 112, a data bus selection circuit 113 and a data input/output buffer circuit 114 arranged in this order along the bit line direction from a side closer to the memory cell sub arrays 10 in this embodiment. Each data access circuit section 11 includes, as the aforementioned driver circuit 111, a driver circuit 111a for driving the read amplifier/write buffer circuit 112, a driver circuit 111b for driving the data bus selection circuit 113, and a driver circuit 111c for driving the data input/output buffer circuit 114. Furthermore, the control circuit section 14 includes, as the aforementioned driver circuit 141, driver circuits 141a, 141b and 141c for respectively driving the driver circuits 111a, 111b and 111c. As the aforementioned signal lines 142, signal lines 142a, 142b and 142c respectively connect the driver circuits 141a, 141b and 141c to the driver circuits 111a, 111b and 111c.

Figure 3:
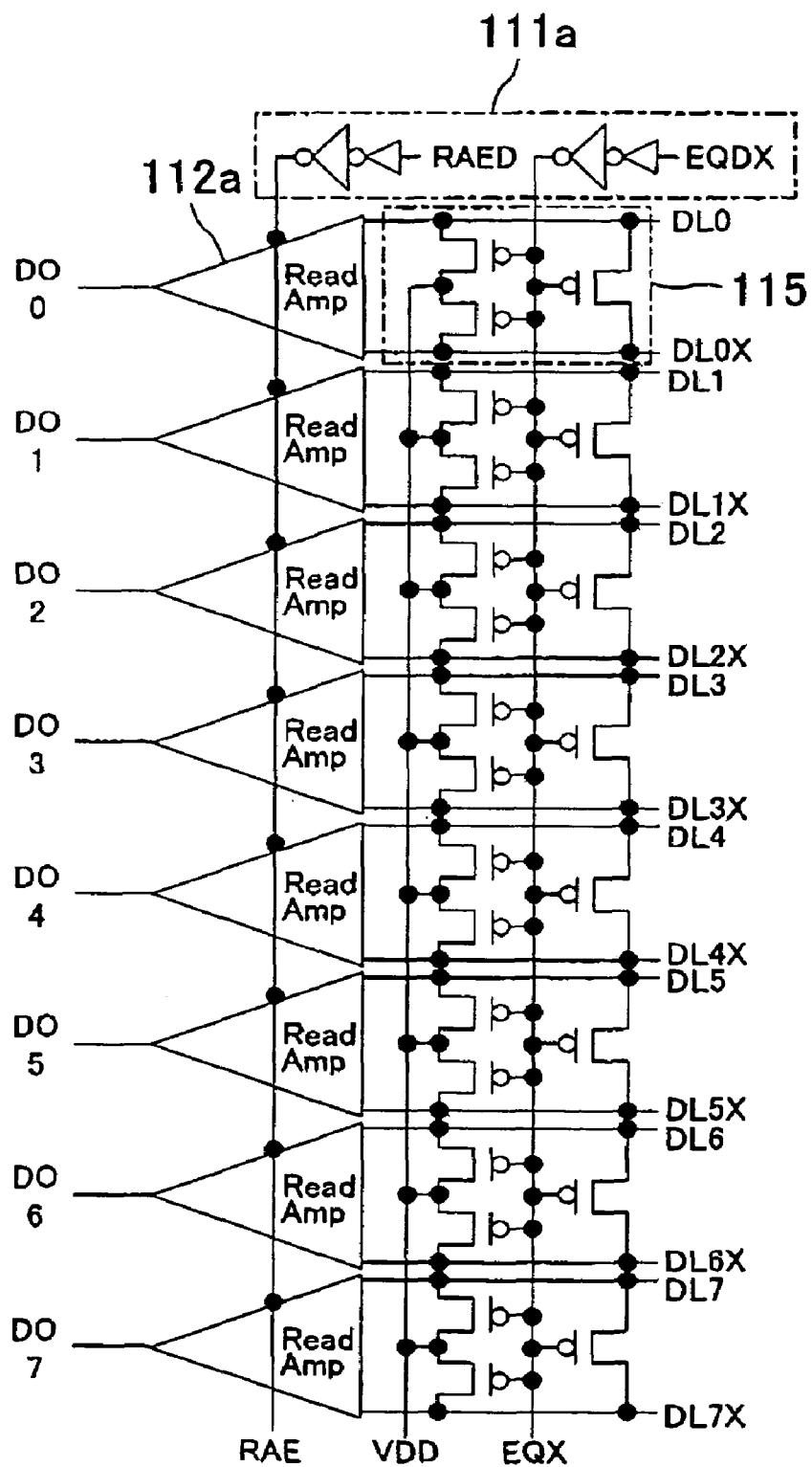
FIG. 3 is a circuit diagram of a read amplifier, a peripheral circuit of the read amplifier and a driver circuit for the read amplifier.

FIG. 3 shows an example of the circuit configuration of the read amplifier/write buffer circuit 112, and particularly a read amplifier circuit, its peripheral circuit and the corresponding driver circuit 111a. The read amplifier circuit 112a amplifies data supplied through complementary data line pair DLi and DLiX extending from the memory cell sub arrays 10, so as to output a signal DOi, wherein i is an integer of 0 through 7. Furthermore, the peripheral circuit 115 of the read amplifier circuit 112a precharges and equalizes the complementary data line pair DLi and DLiX to the level of a voltage VDD.

The read amplifier circuit 112a and its peripheral circuit 115 are activated/deactivated respectively in accordance with signals RAE and EQX output from the driver circuit 111a. The signals RAE and EQX are obtained on the basis of control signals RAED and EQDX output from the driver circuit 141. The driver circuit 111a increases the driving ability of these control signals RAED and EQDX so as to output the signals RAE and EQX.

Figure 4:
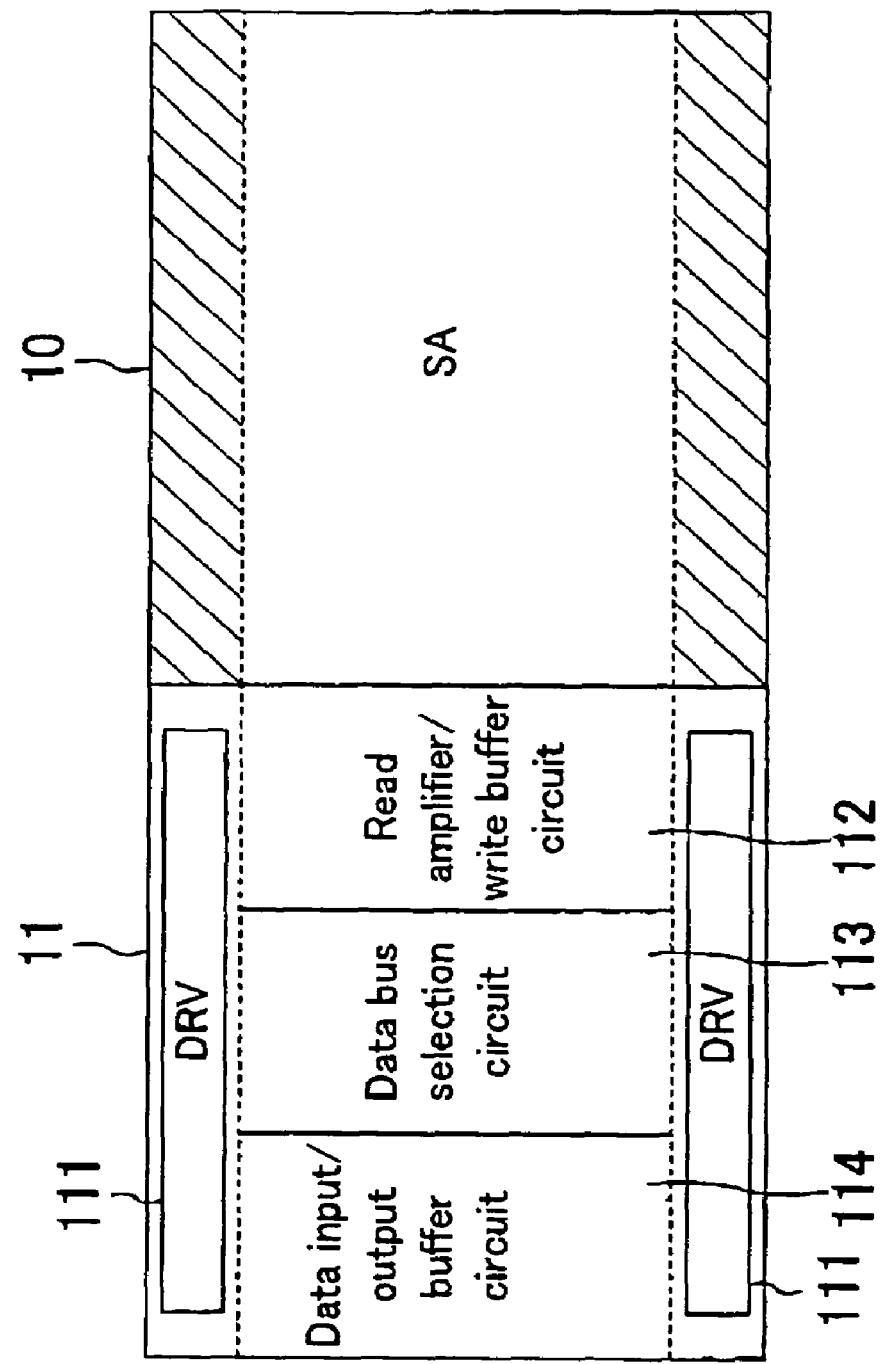
FIG. 4 is a diagram for showing preferable placement of a driver circuit in the data access circuit section.

FIG. 4 is a diagram for showing preferred placement of the driver circuit 111. Each memory cell sub array 10 is generally provided with, for example, a strapping wire or a sub-word driver in order to reduce the wire resistance of the word line. Therefore, the driver circuit 111 is preferably placed in an area extending along the bit line direction from a break area (that is, a hatched portion in FIG. 4) where placement of memory cells is interrupted, such as an area where a contact of a strapping wire or a subword driver is disposed.

Next, the architecture of the power circuit section 12 will be described in detail.

Figure 5:
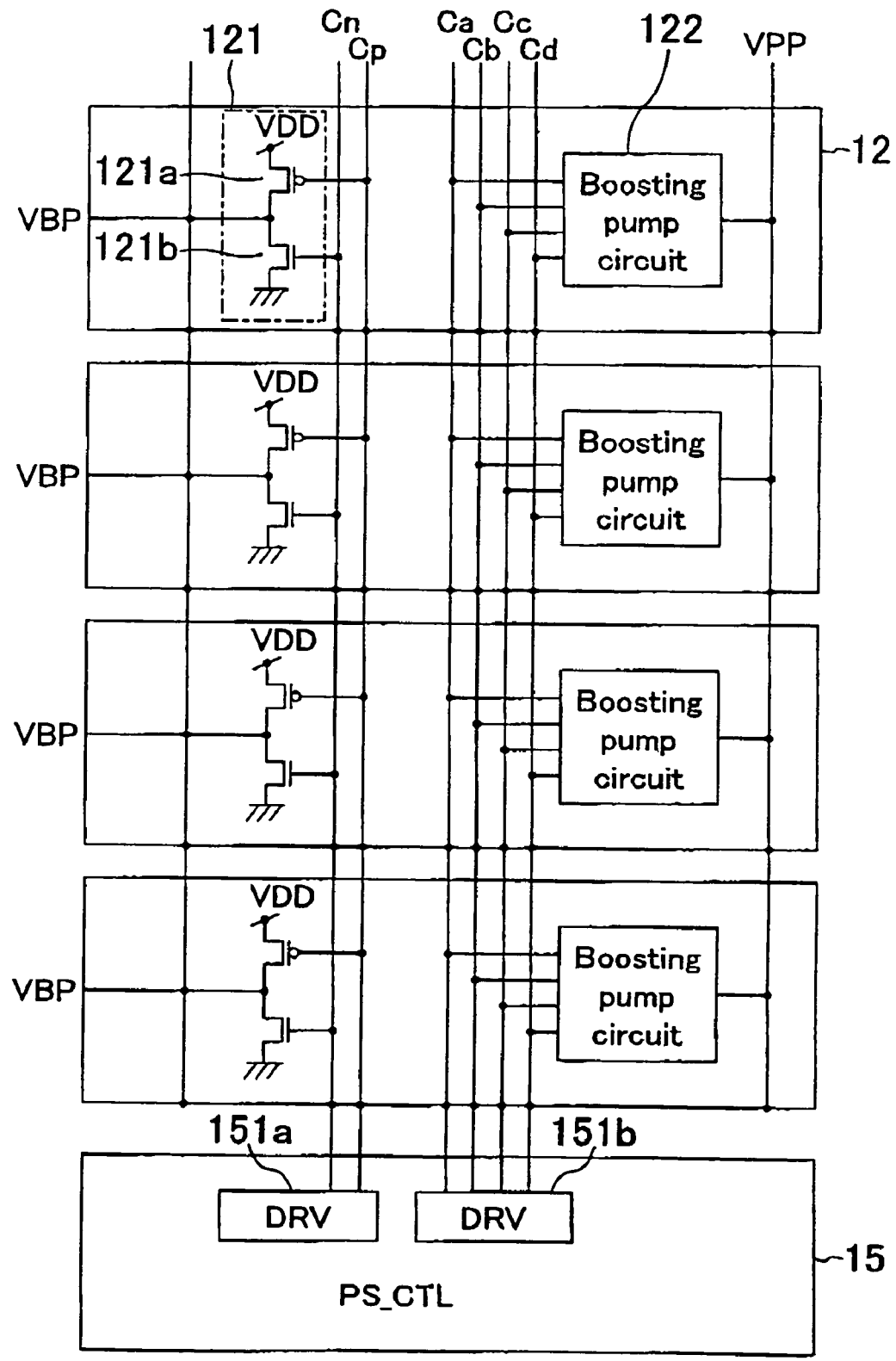
FIG. 5 is a diagram for showing the internal architecture of a power circuit.

FIG. 5 shows the internal architecture of the power circuit section 12. Each power circuit section 12 includes a bit line precharge power circuit 121 for supplying a bit line precharging voltage VBP and a boosting pump circuit 122 working as a word line power circuit for supplying a word line driving voltage VPP. The voltages VBP output by the respective power circuit sections 12 are connected to one another through a common power line. In other words, the voltage VBP is supplied to the whole memory cell array 100 as a common power node.

The bit line precharge power circuit 121 includes a p-channel transistor 121a and an n-channel transistor 121b serially connected to each other and supplies the voltage VBP for precharging a bit line. The gate voltages of the p-channel transistor 121a and the n-channel transistor 121b are controlled by a driver circuit 151a, that is, a part of the driver circuit 151 of the power control circuit section 15, respectively through signal lines Cp and Cn, that is, a part of the signal lines 152. In other words, the output voltage VBP of the bit line precharge power circuit 121 is controlled through the signal lines Cp and Cn.

The driver circuit 151a is a known circuit for controlling the bit line precharge power circuit 121 through the signal lines Cp and Cn so as to attain a desired value of the output voltage VBP.

On the other hand, the boosting pump circuit 122 supplies the voltage VPP to be applied to a word line selected and activated in the memory cell sub array 10. The boosting pump circuit 122 is controlled by the power control circuit section 15 through a driver circuit 151b via signal lines Ca, Cb, Cc and Cd, that is, a part of the signal lines 152.

Figure 6:
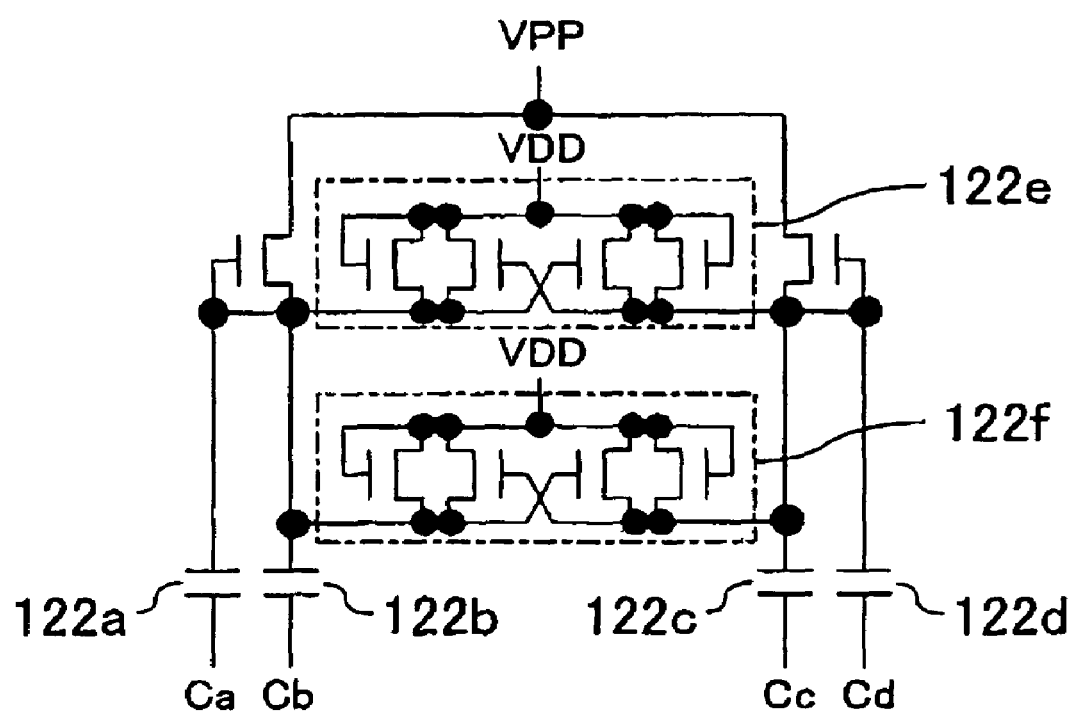
FIG. 6 is a circuit diagram of a boosting pump circuit.

FIG. 6 shows an example of the circuit configuration of the boosting pump circuit 122. Pump capacitors 122a, 122b, 122c and 122d of the boosting pump circuit 122 are provided with control signals respectively through the signal lines Ca, Cb, Cc and Cd. Cross coupled circuits 122e and 122f including a plurality of n-channel transistors are complementarily provided with the control signals through the pump capacitors 122a, 122b, 122c and 122d, and boost potential at one end of the pump capacitor to supply the boosted potential to a VPP node.

The power control circuit section 15 is constructed by, for example, using a VPP potential detection circuit and a ring oscillator circuit.

Although the bit line precharge power circuit 121 and the boosting pump circuit 122 are provided in the power circuit section 12 in this embodiment, one of them may be provided or another power circuit may be provided instead.

The layout of the semiconductor storage circuit 1 of this embodiment is generated as follows: First, layouts of the memory cell sub array 10, the data access circuit section 11, the control circuit section 14, the row decoder section 13, the power circuit section 12, the power control circuit section 15 and the like are respectively designed. Next, these components are placed in the form of an array as shown in FIG. 1. At this point, since the data access circuit section 11, the four memory cell sub arrays 10 arranged along the bit line direction and the power circuit section 12 are all disposed at an equal pitch along the word line direction, a group of these components arranged along the bit line direction, namely, a group shown as a circuit extension unit UNIT1 in FIG. 1, corresponds to a unit to be used in changing the storage capacity of the semiconductor storage circuit 1. In other words, the storage capacity can be set to a desired value by determining how many circuit extension units UNIT1 are placed along the word line direction. Furthermore, in the case where data are fetched in parallel from the respective data access circuit sections 11 and data are input in parallel to the respective data access circuit sections 11, the I/O width of the semiconductor storage circuit 1 can be also set to a desired value by determining how many circuit extension units UNIT1 are placed along the word line direction.

In this manner, a semiconductor storage circuit having optimum chip area and optimum circuit characteristics can be designed by a very easy way.

Although the data access circuit section 11 and the power circuit section 12 are disposed at the respective ends of the line of the memory cell sub arrays 10 in this embodiment, the order of the placement is not particularly limited.

At this point, the power supplying ability of the power circuit section 12 included in each circuit extension unit UNIT1 is optimized to be necessary and sufficient for driving the four memory cell sub arrays 10. Also, the driving ability of the driver circuit 111 is optimized to be necessary and sufficient for driving the data access circuits included in one data access circuit section 11. In this manner, the semiconductor storage circuit can attain optimum driving ability according to the scale of the memory cell array by merely placing a desired number of circuit extension units UNIT1 along the word line direction.

Furthermore, the driver circuit 141, the word line driver circuits 17 and the driver circuit 151 are linearly arranged along the bit line direction, so that none of the other circuits included in the semiconductor storage circuit may be disposed in the area where these driver circuits are linearly arranged. In this manner, the driving abilities of these driver circuits can be optimally set merely by increasing/reducing the circuit areas occupied by the driver circuits along the word line direction simultaneously by the same length in accordance with the number of circuit extension units UNIT1 to be placed. Also, occurrence of a useless area resulting from the increase/reduction of the driver circuit area can be minimized. In other words, driver circuits having optimum driving abilities can be thus efficiently placed in accordance with the number of used circuit extension units UNIT1 without causing a useless space.

As described so far, according to this embodiment, the semiconductor storage circuit 1 that has necessary storage capacity and I/O width, has circuit characteristics optimized from the viewpoint of the operation speed and power consumption and has a small chip area can be obtained merely by placing a desired number of circuit extension units UNIT1 along the word line direction.

The layout of the memory cell array 100 of this embodiment is herein described merely as an example, and the actual layout is variously changed in accordance with necessary storage capacity and I/O width. Also, the row decoder sections 13 are placed in the middle of the memory cell array 100 in this embodiment, which does not limit the invention.

Furthermore, the above description is given on the assumption that the semiconductor storage circuit 1 is a DRAM, which does not limit the invention. The semiconductor storage circuit of this invention is applicable to various ROMs such as a mask ROM and a flash memory and various RAMs such as an SRAM (Static Random Access Memory). For example, when the invention is applied to an SRAM, there is no need to provide the boosting pump circuit 122. Alternatively, when the invention is applied to any of various ROMs, there is no need to provide the power circuit section 12.

Moreover, although the semiconductor storage circuit 1 is suitably used in an embedded memory such as an embedded DRAM included in a system LSI, it may be used as a stand-alone memory.

In addition, although each circuit extension unit UNIT1 corresponds to one memory cell sub array 10 with respect to the word line direction in this embodiment, it goes without saying that, for example, two or more memory cell sub arrays 10 arranged along the word line direction may be included in one circuit extension unit if necessary. In this case, the data access circuit sections or the power circuit sections may be disposed at a pitch equal to the pitch at which the two or more the memory cell sub arrays 10 are disposed.

Embodiment 2

Figure 7:
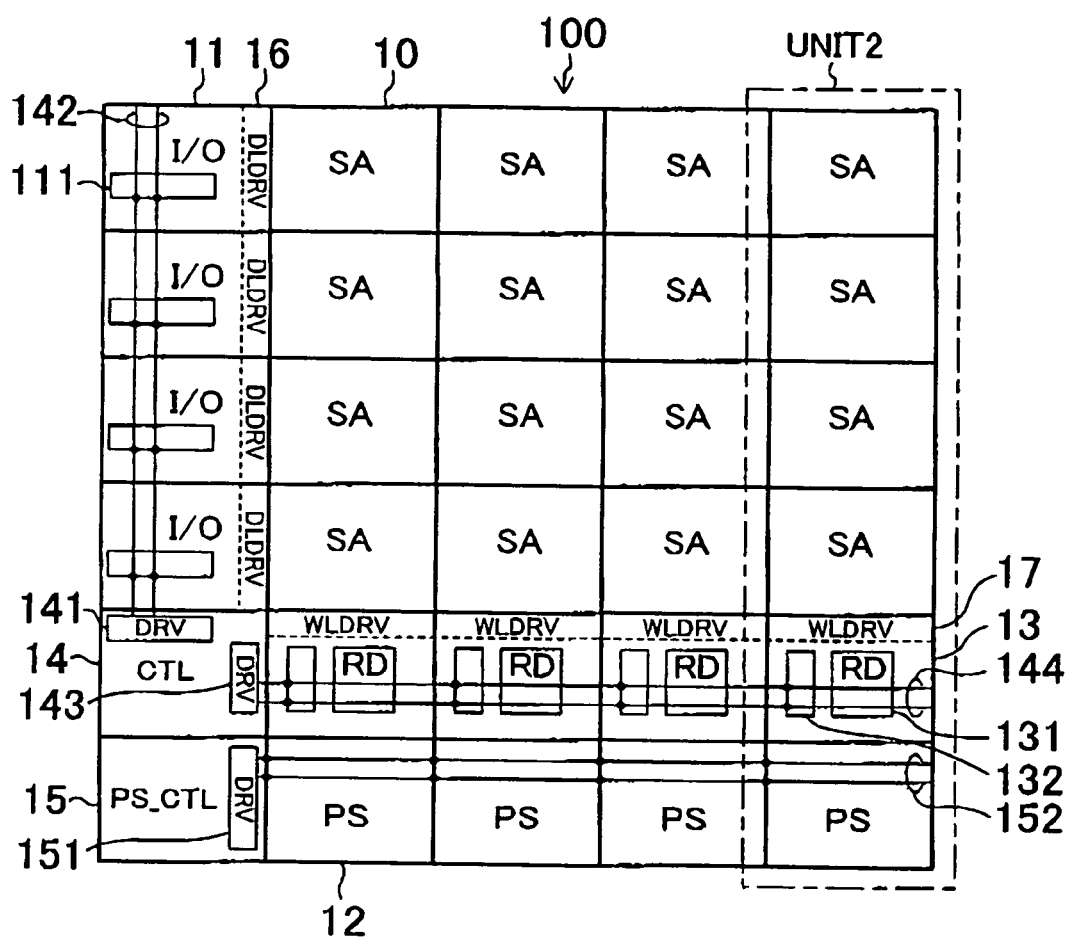
FIG. 7 is a layout diagram of a semiconductor storage circuit according to Embodiment 2 of the invention.

FIG. 7 shows the layout of a semiconductor storage circuit according to Embodiment 2 of the invention. The semiconductor storage circuit 2 of this embodiment includes a memory cell array 100 in which memory cell sub arrays 10 are arranged in an array of four lines along a bit line direction (i.e., a column direction corresponding to the lateral direction on FIG. 7) by four lines along a word line direction (i.e., a row direction corresponding to the longitudinal direction on FIG. 7). In this embodiment, like reference numerals are used to refer to like elements used in the semiconductor storage circuit 1 of Embodiment 1 shown in FIG. 1 so as to omit the description, and merely a difference from Embodiment 1 is herein described.

The semiconductor storage circuit 2 has a different architecture from the semiconductor storage circuit 1 of Embodiment 1 in power circuit sections 12 being arranged along the bit line direction together with a line of the four memory cell sub arrays 10 arranged along the word line direction.

The layout of the semiconductor storage circuit 2 of this embodiment is generated as follows: First, layouts of the memory cell sub array 10, the data access circuit section 11, the control circuit section 14, the row decoder section 13, the power circuit section 12, the power control circuit section 15 and the like are respectively designed. Next, these components are placed in the form of an array as shown in FIG. 7. At this point, since the row decoder section 13, the four memory cell sub arrays 10 arranged along the word line direction and the power circuit section 12 are all disposed at an equal pitch along the bit line direction, a group of these components arranged along the word line direction, namely, a group shown as a circuit extension unit UNIT2 in FIG. 7, corresponds to a unit to be used in changing the storage capacity of the semiconductor storage circuit 2. In other words, the storage capacity can be set to a desired value by determining how many circuit extension units UNIT2 are placed along the bit line direction.

In this manner, a semiconductor storage circuit having optimum chip area and optimum circuit characteristics can be designed by a very easy way.

At this point, similarly to Embodiment 1, the power supplying ability of the power circuit section 12 included in each circuit extension unit UNIT2 is optimized to be necessary and sufficient for driving the four memory cell sub arrays 10. Also, the driving ability of each row decoder driver circuit 132 is optimized to be necessary and sufficient for driving one row decoder circuit 131. In this manner, the semiconductor storage circuit can attain optimum driving ability according to the scale of the memory cell array by merely placing a desired number of circuit extension units UNIT2 along the bit line direction.

Furthermore, the driver circuit 143, the data line driver circuits 16 and the driver circuit 151 are linearly arranged along the word line direction, so that none of the other circuits included in the semiconductor storage circuit may be disposed in the area where these driver circuits are linearly arranged. In this manner, the driving abilities of these driver circuits can be optimally set merely by increasing/reducing the circuit areas occupied by the driver circuits along the bit line direction simultaneously by the same length in accordance with the number of circuit extension units UNIT2 to be placed. Also, occurrence of a useless area resulting from the increase/reduction of the driver circuit area can be minimized. In other words, driver circuits having optimum driving abilities can be thus efficiently placed in accordance with the number of used circuit extension units UNIT2 without causing a useless space.

As described so far, according to this embodiment, the semiconductor storage circuit 2 that has necessary storage capacity, has circuit characteristics optimized from the viewpoint of the operation speed and power consumption and has a small chip area can be obtained merely by placing a desired number of circuit extension units UNIT2 along the bit line direction.

Furthermore, although each circuit extension unit UNIT2 corresponds to one memory cell sub array 10 with respect to the bit line direction in this embodiment, it goes without saying that, for example, two or more memory cell sub arrays 10 arranged along the bit line direction may be included in one circuit extension unit if necessary. In this case, the row decoder circuit sections or the power circuit sections may be disposed at a pitch equal to the pitch at which the two or more memory cell sub arrays 10 are disposed.

Figure 8:
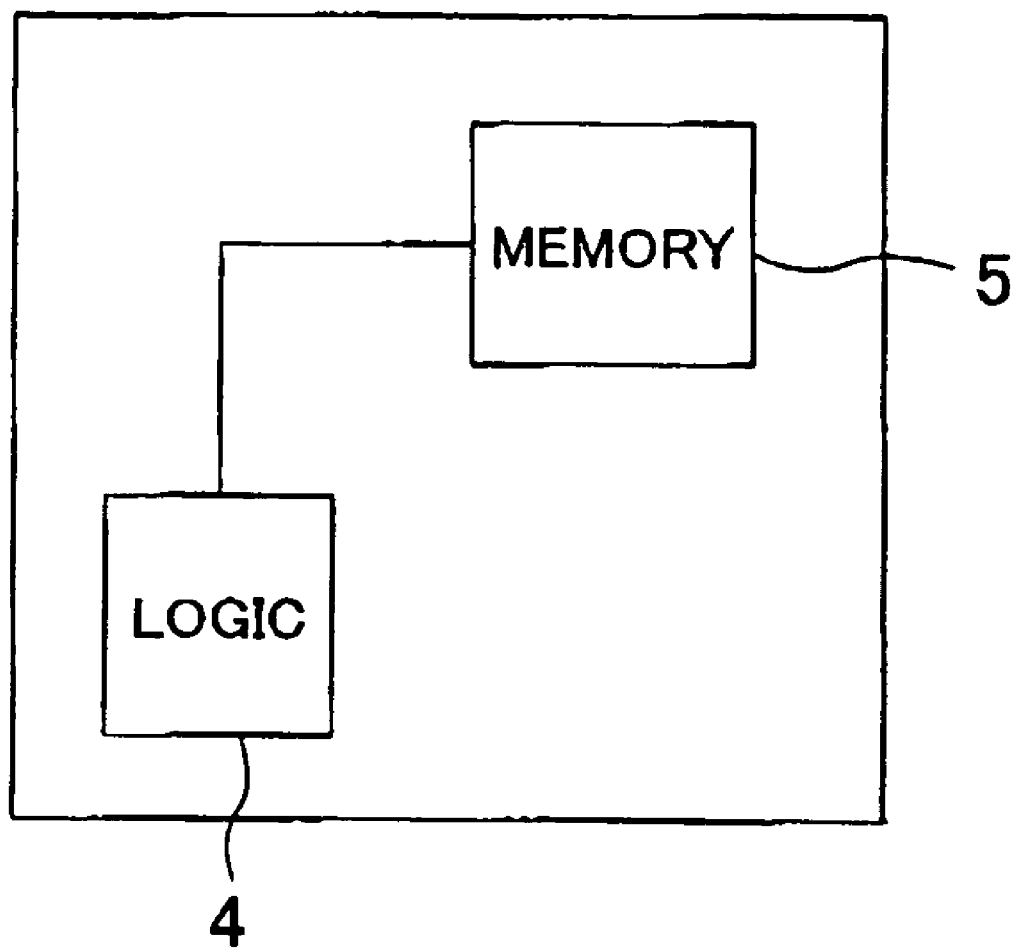
FIG. 8 is a schematic view of a system LSI using a semiconductor integrated circuit of this invention as an embedded memory.

Moreover, similarly to Embodiment 1, although the semiconductor storage circuit 2 is suitably used in an embedded memory included in a system LSI, it may be used as a stand-alone memory. FIG. 8 shows the architecture in which the semiconductor storage circuit is used in an embedded memory 3. The semiconductor storage circuit 1 or 2 is used as a storage unit 5. An operation unit 4 sends/receives data to/from and controls the storage unit 5.

As described so far, the present invention provides a semiconductor storage circuit which can perform a high speed or low power consumption operation by optimizing the driving ability of a driver circuit in accordance with a storage capacity or the like and in which the storage capacity is set to a desired value while suppressing a chip area. Also, such a semiconductor storage circuit can be provided in a short period of time at low cost by using the layout method for a semiconductor storage circuit of this invention.

What is claimed is:

1. A semiconductor storage circuit comprising:
    a memory cell array in which memory cell sub arrays each including a plurality of memory cells are arranged in an array along a bit line direction corresponding to a column direction and a word line direction corresponding to a row direction,
    data access circuit sections each of which is provided correspondingly to a column of said memory cell sub arrays arranged along the bit line direction and includes a data access circuit for making data accesses to memory cells of one or more of said memory cell sub arrays belonging to said column and a first driver circuit for driving said data access circuit, and
    a control circuit section for controlling said data access circuit through said first driver circuit,
    wherein said data access circuit sections are disposed along the word line direction at a pitch equal to a pitch at which one or more of said memory cell sub arrays are disposed along the word line direction.

2. The semiconductor storage circuit of claim 1,
    wherein the pitch at which said data access circuit sections are disposed along the word line direction corresponds to a length along the word line direction of a circuit extension unit used for increasing storage capacity of said semiconductor storage circuit by increasing a number of said memory cell sub arrays arranged along the word line direction.

3. The semiconductor storage circuit of claim 1, further comprising:
    power circuit sections each of which is provided correspondingly to a column of said memory cell sub arrays arranged along the bit line direction and supplies a power voltage used in said semiconductor storage circuit; and
    a power control circuit section for controlling a voltage supplying operation of said power circuit sections,
    wherein said power circuit sections are disposed along the word line direction at a pitch equal to the pitch at which one or more of said memory cell sub arrays are disposed along the word line direction.

4. The semiconductor storage circuit of claim 3,
    wherein the pitch at which said power circuit sections are disposed along the word line direction corresponds to a length along the word line direction of a circuit extension unit used for increasing storage capacity of said semiconductor storage circuit by increasing a number of said memory cell sub arrays arranged along the word line direction.

5. The semiconductor storage circuit of claim 1, further comprising:
    a row decoder circuit for selecting a word line of said memory cell array,
    wherein each of said data access circuit sections includes a data line driver circuit for driving a data line of said memory cell array, said control circuit section includes a second driver circuit and controls an operation of said row decoder circuit through said second driver circuit, and said data line driver circuit and said second driver circuit are linearly arranged.

6. The semiconductor storage circuit of claim 1, wherein each of said memory cell sub arrays of said memory cell array includes a break area where placement of said memory cells is interrupted and said first driver circuit is disposed in each of said data access circuit sections in an area extending from said break area along the bit line direction.

7. The semiconductor storage circuit of claim 6, wherein said break area corresponds to a contact area of a strapping wire used for reducing resistance of a word line of each of said memory cell sub arrays of said memory cell array.

8. The semiconductor storage circuit of claim 6, wherein said break area corresponds to an area occupied by a sub word driver provided to each of said memory cell sub arrays of said memory cell array.

9. A semiconductor storage circuit comprising:

a memory cell array in which memory cell sub arrays each including a plurality of memory cells are arranged in an array along a bit line direction corresponding to a column direction and a word line direction corresponding to a row direction;

row decoder sections each of which is provided correspondingly to a row of said memory cell sub arrays arranged along the word line direction and includes a row decoder circuit for selecting a word line of one or more of said memory cell sub arrays belonging to said row and a row decoder driver circuit for driving said row decoder circuit, and a control circuit section for controlling an operation of said row decoder circuit through said row decoder driver circuit, wherein said row decoder sections are disposed along the bit line direction at a pitch equal to a pitch at which one or more of said memory cell sub arrays are disposed along the bit line direction.

10. The semiconductor storage circuit of claim 9, wherein the pitch at which said row decoder sections are disposed along the bit line direction corresponds to a length along the bit line direction of a circuit extension unit used for increasing storage capacity of said semiconductor storage circuit by increasing a number of said memory cell sub arrays arranged along the bit line direction.

11. The semiconductor storage circuit of claim 9, further comprising:

power circuit sections each of which is provided correspondingly to a row of said memory cell sub arrays arranged along the word line direction and supplies a power voltage used in said semiconductor storage circuit; and a power control circuit section for controlling a voltage supplying operation of said power circuit sections, wherein said power circuit sections are disposed along the bit line direction at a pitch equal to the pitch at which one or more of said memory cell sub arrays are disposed along the bit line direction.

12. The semiconductor storage circuit of claim 11, wherein the pitch at which said power circuit sections are disposed along the bit line direction corresponds to a length along the bit line direction of a circuit extension unit used for increasing storage capacity of said semiconductor storage circuit by increasing a number of said memory cell sub arrays arranged along the bit line direction.

13. The semiconductor storage circuit of claim 9, further comprising:

a data access circuit for making data accesses to said memory cells of said memory cell array, wherein each of said row decoder sections includes a word line driver circuit for driving a word line of said memory cell array selected by said row decoder circuit, said control circuit section includes a third driver circuit and controls an operation of said data access circuit through said third driver circuit, and said word line driver circuit and said third driver circuit are linearly arranged.

14. A semiconductor storage circuit comprising:

a memory cell array in which memory cell sub arrays each including a plurality of memory cells are arranged in an array along a bit line direction corresponding to a column direction and a word line direction corresponding to a row direction;

data access circuit sections each of which is provided correspondingly to a column of said memory cell sub arrays arranged along the bit line direction and includes a data access circuit for making data accesses to one or more of said memory cell sub arrays belonging to said column and a first driver circuit for driving said data access circuit;

row decoder sections each of which is provided correspondingly to a row of said memory cell sub arrays arranged along the word line direction and includes a row decoder circuit for selecting a word line of one or more of said memory cell sub arrays belonging to said row and a row decoder driver circuit for driving said row decoder circuit; and a control circuit section for controlling an operation of said data access circuit through said first driver circuit and controlling an operation of said row decoder circuit through said row decoder driver circuit;

wherein said data access circuit sections are disposed along the word line direction at a pitch equal to a pitch at which one or more, of said memory cell sub arrays are dispose along the word line direction, and said row decoder sections are disposed along the bit line direction at a pitch equal to a pitch at which one or more of said memory cell arrays are disposed along the bit line direction.

15. The semiconductor storage circuit of claim 14, wherein the pitch at which said data access circuit sections are disposed along the word line direction corresponds to a length along the word line direction of a circuit extension unit used for increasing storage capacity of said semiconductor storage circuit by increasing a number of said memory cell sub arrays arranged along the word line direction, and the pitch at which said row decoder sections are disposed along the bit line direction corresponds to a length along the bit line direction of a circuit extension unit for increasing the storage capacity of said semiconductor storage, circuit by increasing a umber of said memory cell sub arrays arranged along the bit line direction.

16. The semiconductor storage circuit of claim 14, further comprising:

power circuit sections each of which is provided correspondingly to a column of said memory cell sub arrays arranged along the bit line direction and supplies a power voltage used in said semiconductor storage circuit; and a power control circuit section for controlling a voltage supplying operation of said power circuit sections, wherein said power circuit sections are disposed along the word line direction at a pitch equal to the pitch at which one or more of said memory cell sub arrays are disposed along the word line direction.

17. The semiconductor storage circuit of claim 16, wherein the pitch at which said power circuit sections are disposed along the word line direction corresponds to a length along the word line direction of a circuit extension unit used for increasing storage capacity of said semiconductor storage circuit by increasing a number of said memory cell sub arrays arranged along the word line direction.

18. The semiconductor storage circuit of claim 14, further comprising:

power circuit sections each of which is provided correspondingly to a row of said memory cell sub arrays arranged along the word line direction and supplies a power voltage used in said semiconductor storage circuit; and a power control circuit section for controlling a voltage supplying operation of said power circuit sections, wherein said power circuit sections are disposed along the bit line direction at a pitch equal to the pitch at which one or more of said memory cell sub arrays are disposed along the bit line direction.

19. The semiconductor storage circuit of claim 18, wherein the pitch at which said power circuit sections are disposed along the bit line direction corresponds to a length along the bit line direction of a circuit extension unit used for increasing storage capacity of said semiconductor storage circuit by increasing a number of said memory cell sub arrays arranged along the bit line direction.

20. The semiconductor storage circuit of any one of claims 3, 11, 16 and 18, wherein each of said power circuit sections includes at least one of a bit line precharge power circuit for supplying a precharging voltage for a bit line of said memory cell sub arrays and a word line power circuit for supplying an activating voltage for a word line of said memory cell sub arrays.

21. A layout method for a semiconductor storage circuit including a memory cell array in which memory cell sub arrays each including a plurality of memory cells are arranged in an array along a bit line direction corresponding to a column direction and a word line direction corresponding to a row direction, comprising the steps of:

respectively generating layouts of said memory cell sub arrays and a data access circuit section which is provided correspondingly to a column of said memory cell sub arrays arranged along the bit line direction and includes a data access circuit for making data accesses to said memory cells of one or more of said memory cell sub arrays belonging to said column and a first driver circuit for driving said data access circuit; and repeatedly placing said memory cell sub arrays and said data access circuit section along the word line direction in such a manner that said data access circuit sections are disposed along the word line direction at a pitch equal to a pitch at which one or more of said memory cell sub arrays are disposed along the word line direction.

22. The layout method for a semiconductor storage circuit of claim 21, wherein the pitch at which said data access circuit sections are disposed along the word line direction corresponds to a length along the word line direction of a circuit extension unit used for increasing storage capacity of said semiconductor storage circuit by increasing a number of said memory cell sub arrays arranged along the word line direction.

23. The layout method for a semiconductor storage circuit of claim 21, further comprising the steps of:

generating a layout of a power circuit section which is provided correspondingly to a column of said memory cell sub arrays arranged along the bit line direction and supplies a power voltage used in said semiconductor storage circuit, and repeatedly placing said power circuit section along the word line direction in such a manner that said power circuit sections are disposed along the word line direction at a pitch equal to the pitch at which one or more of said memory cell sub arrays are disposed along the word line direction.

24. The layout method for a semiconductor storage circuit of claim 23, wherein the pitch at which said power circuit sections are disposed along the word line direction corresponds to a length along the word line direction of a circuit extension unit used for increasing storage capacity of said semiconductor storage circuit by increasing a number of said memory cell sub arrays arranged along the word line direction.

25. The layout method for a semiconductor storage circuit of claim 21, further comprising the steps of:

generating a layout of a control circuit section that has a second driver circuit and controls an operation of a row decoder circuit for selecting a word line of said memory cell array through said second driver circuit, and placing said control circuit section to be arranged along the word line direction together with said data access circuit sections, wherein each of said data access circuit sections includes a data line driver circuit for driving a data line of said memory cell array, and said data line driver circuit and said second driver circuit are linearly arranged.

26. The layout method for a semiconductor storage circuit of claim 25, wherein lengths along the bit line direction of circuit areas of said data line driver circuit and said second driver circuit are increased or reduced in accordance with increase or reduction of storage capacity of said semiconductor storage circuit performed by increasing or reducing a number of said memory cell sub arrays arranged along the bit line direction.

27. A layout method for a semiconductor storage circuit including a memory cell array in which memory cell sub arrays each including a plurality of memory cells are arranged in an array along a bit line direction corresponding to a column direction and a word line direction corresponding to a row direction, comprising the steps of:

respectively generating layouts of said memory cell sub arrays and a row decoder section which is provided correspondingly to a row of said memory cell sub arrays arranged along the word line direction and includes a row decoder circuit for selecting a word line of one or more of said memory cell sub arrays belonging to said row and a row decoder driver circuit for driving said row decoder circuit; and repeatedly placing said memory cell sub arrays and said row decoder section along the bit line direction in such a manner that said row decoder sections are disposed along the bit line direction at a pitch equal to a pitch at which one or more of said memory cell sub arrays are disposed along the bit line direction.

28. The layout method for a semiconductor storage circuit of claim 27, wherein the pitch at which said row decoder sections are disposed along the bit line direction corresponds to a length along the bit line direction of a circuit extension unit used for increasing storage capacity of said semiconductor storage circuit by increasing a number of said memory cell sub arrays arranged along the bit line direction.

29. The layout method for a semiconductor storage circuit of claim 27, further comprising the steps of:

generating a layout of a power circuit section which is provided correspondingly to a row of said memory cell sub arrays arranged along the word line direction and supplies a power voltage used in said semiconductor storage circuit; and repeatedly placing said power circuit section along the bit line direction in such a manner that said power circuit sections are disposed along the bit line direction at a pitch equal to the pitch at which one or more of said memory cell sub arrays are disposed along the bit line direction.

30. The layout method for a semiconductor storage circuit of claim 29, wherein the pitch at which said power circuit sections are disposed along the bit line direction corresponds to a length along the bit line direction of a circuit extension unit used for increasing storage capacity of said semiconductor storage circuit by increasing a number of said memory cell sub arrays arranged along the bit line direction.

31. The layout method for a semiconductor storage circuit of claim 27; further comprising the steps of:

generating a layout of a control circuit section that has a third driver circuit and controls an operation of a data access circuit for making data accesses to said memory cells of said memory cell array through said third driver circuit; and placing said control circuit section to be arranged along the bit line direction together with said row decoder sections, wherein said row decoder section includes a word line driver circuit for driving a word line of said memory cell array selected by said row decoder circuit, and said word line driver circuit and said third driver circuit are linearly arranged.

32. The layout method for a semiconductor storage circuit of claim 31, wherein lengths along the word line direction of circuit areas of said word line driver circuit and said third driver circuit are increased or reduced in accordance with increase or reduction of storage capacity of said semiconductor storage circuit performed by increasing or reducing a number of said memory cell sub arrays arranged along the word line direction.

33. A layout method for a semiconductor storage circuit including a memory cell array in which memory cell sub arrays each including a plurality of memory cells are arranged in an array along a bit line direction corresponding to a column direction and a word line direction corresponding to a row direction, comprising the steps of:

respectively generating layouts of said memory cell sub arrays, a data access circuit section which is provided correspondingly to a column of said memory cell sub arrays arranged along the bit line direction and includes a data access circuit for making data accesses to said memory cells of one or more of said memory cell sub arrays belonging to said column and a first driver circuit for driving said data access circuit, and a row decoder section which is provided correspondingly to a row of said memory cell sub arrays arranged along the word line direction and includes a row decoder circuit for selecting a word line of one or more of said memory cell sub arrays belonging to said row and a row decoder driver circuit for driving said row decoder circuit; and repeatedly placing said memory cell sub arrays and said data access circuit section along the word line direction in such a manner that said data access circuit sections are disposed along the word line direction at a pitch equal to a pitch at which one or more of said memory cell sub arrays are disposed along the word line direction and repeatedly placing said memory cell sub arrays and said row decoder section along the bit line direction in such a manner that said row decoder sections are disposed along the bit line direction at a pitch equal to a pitch at which one or more of said memory cell sub arrays are disposed along the bit line direction.

34. The layout method for a semiconductor storage circuit of claim 33, wherein the pitch at which said data access circuit sections are disposed along the word line direction corresponds to a length along the word line direction of a circuit extension unit used for increasing storage capacity of said semiconductor storage circuit by increasing a number of said memory cell sub arrays arranged along the word line direction, and the pitch at which said row decoder sections are disposed along the bit line direction corresponds to a length along the bit line direction of a circuit extension unit used for increasing the storage capacity of said semiconductor storage circuit by increasing a number of said memory cell sub arrays arranged along the bit line direction.

35. The layout method for a semiconductor storage circuit of claim 33, further comprising the steps of:

generating a layout of a power circuit section which is provided correspondingly to a column of said memory cell sub arrays arranged along the bit line direction and supplies a power voltage used in said semiconductor storage circuit; and repeatedly placing said power circuit section along the word line direction in such a manner that said power circuit sections are disposed along the word line direction at a pitch equal to the pitch at which one or more of said memory cell sub arrays are disposed along the word line direction.

36. The layout method for a semiconductor storage circuit of claim 35,
wherein the pitch at which said power circuit sections are disposed along the word line direction corresponds to a length along the word line direction of a circuit extension unit used for increasing storage capacity of said semiconductor storage circuit by increasing a number of said memory cell sub arrays arranged along the word line direction.

37. The layout method for a semiconductor storage circuit of claim 33, further comprising the steps of:
generating a layout of a power circuit section that is provided correspondingly to a row of said memory cell sub arrays arranged along the word line direction and supplies a power voltage used in said semiconductor storage circuit; and
repeatedly placing said power circuit section along the bit line direction in such a manner that said power circuit sections are disposed along the bit line direction at a pitch equal to the pitch at which one or more of said memory cell sub arrays are disposed along the bit line direction.

38. The layout method for a semiconductor storage circuit of claim 37,
wherein the pitch at which said power circuit sections are disposed along the bit line direction corresponds to a length along the bit line direction of a circuit extension unit used for increasing storage capacity of said semiconductor storage, circuit by increasing a number of said memory cell sub arrays arranged along the bit line direction.

* * * * *